US011307685B2

(12) United States Patent
Jung et al.

(10) Patent No.: US 11,307,685 B2
(45) Date of Patent: Apr. 19, 2022

(54) DISPLAY DEVICE INCLUDING A SENSOR AND A PROTECTIVE LAYER

(71) Applicant: SAMSUNG DISPLAY CO., LTD., Yongin-Si (KR)

(72) Inventors: Kyungho Jung, Seongnam-si (KR); Jin Hyun, Hwaseong-si (KR); Jaeho Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/379,415

(22) Filed: Apr. 9, 2019

(65) Prior Publication Data

US 2019/0326367 A1    Oct. 24, 2019

(30) Foreign Application Priority Data

Apr. 24, 2018 (KR) ........................ 10-2018-0047524

(51) Int. Cl.
*G06F 3/041* (2006.01)
*G06K 9/00* (2006.01)
*G09G 3/3225* (2016.01)

(52) U.S. Cl.
CPC ....... *G06F 3/0412* (2013.01); *G06K 9/00013* (2013.01); *G09G 3/3225* (2013.01)

(58) Field of Classification Search
CPC .............. G06K 9/00013; G09G 3/3225; H01L 27/3234
See application file for complete search history.

(56) References Cited

U.S. PATENT DOCUMENTS

| 8,183,873 | B2   | 5/2012  | Kobayashi et al. |
| 8,766,099 | B2 * | 7/2014  | Yeates .................. H05K 1/0271 174/254 |
| 9,679,188 | B2   | 6/2017  | Lin |
| 10,489,629 | B1 * | 11/2019 | Jiang ..................... G06K 9/0004 |
| 2016/0171271 | A1 * | 6/2016  | Lundahl ............ G06K 9/00053 382/124 |
| 2016/0232395 | A1 * | 8/2016  | Han ....................... G06F 1/1684 |
| 2016/0350580 | A1 * | 12/2016 | Pyun ................... G06K 9/00013 |
| 2017/0045918 | A1 * | 2/2017  | Han ......................... G06F 1/163 |
| 2017/0212613 | A1   | 7/2017  | Hwang et al. |
| 2017/0300736 | A1 * | 10/2017 | Song .................... G06K 9/0004 |
| 2017/0372114 | A1 * | 12/2017 | Cho ...................... G01J 1/0233 |
| 2017/0372123 | A1 * | 12/2017 | Kim ..................... G06K 9/0002 |
| 2018/0089492 | A1 * | 3/2018  | Cai ..................... G06K 9/00013 |
| 2018/0151641 | A1 * | 5/2018  | Choo .................... G06F 1/1643 |
| 2018/0213646 | A1 * | 7/2018  | Benkley, III ............ H04M 1/67 |
| 2018/0315799 | A1 * | 11/2018 | Jiang ..................... G09G 3/3208 |

(Continued)

FOREIGN PATENT DOCUMENTS

| JP | 2010-103240 A    | 5/2010 |
| KR | 10-2017-0087635 A | 7/2017 |

*Primary Examiner* — Chad M Dicke
(74) *Attorney, Agent, or Firm* — Lewis Roca Rothgerber Christie LLP

(57) ABSTRACT

A display device includes: a display module including a display area and a non-display area; a protective layer on a lower surface of the display module and including an opening area overlapping with the display area; a sensor unit overlapping with the display area, covering the opening area, and arranged on the protective layer; and an adhesive member adhering the sensor unit and the protective layer.

19 Claims, 12 Drawing Sheets

(56) References Cited

U.S. PATENT DOCUMENTS

| | | | |
|---|---|---|---|
| 2018/0365472 A1* | 12/2018 | Cai | H01L 27/3234 |
| 2018/0373913 A1* | 12/2018 | Panchawagh | G01S 15/8925 |
| 2019/0012512 A1* | 1/2019 | He | G02B 6/0055 |
| 2019/0034688 A1* | 1/2019 | Lee | G01D 5/2405 |
| 2019/0087630 A1* | 3/2019 | Seo | G06K 9/00053 |
| 2019/0095004 A1* | 3/2019 | Son | H03K 17/962 |
| 2019/0095672 A1* | 3/2019 | Yeke Yazdandoost | H01L 27/1462 |
| 2019/0115384 A1* | 4/2019 | Ikehara | H01L 27/14645 |
| 2019/0197286 A1* | 6/2019 | Kim | H01L 27/3225 |
| 2019/0205594 A1* | 7/2019 | Lee | H01L 27/323 |
| 2019/0205596 A1* | 7/2019 | Kim | B06B 1/0692 |
| 2019/0220649 A1* | 7/2019 | Zhu | G06K 9/0004 |
| 2019/0244007 A1* | 8/2019 | Bach | G06K 9/00087 |
| 2019/0267434 A1* | 8/2019 | Liu | G06F 1/1637 |
| 2019/0272407 A1* | 9/2019 | Park | H01L 27/3234 |
| 2019/0296266 A1* | 9/2019 | Kim | H01L 27/32 |
| 2019/0326367 A1* | 10/2019 | Jung | G06F 3/0412 |
| 2020/0019747 A1* | 1/2020 | Yang | H01L 27/3234 |
| 2020/0033674 A1* | 1/2020 | Fujita | G02B 5/30 |

* cited by examiner

DISPLAY DEVICE INCLUDING A SENSOR AND A PROTECTIVE LAYER

CROSS-REFERENCE TO RELATED APPLICATION

This application claims priority to and the benefit of Korean Patent Application No. 10-2018-0047524, filed on Apr. 24, 2018 in the Korean Intellectual Property Office, the entire content of which is hereby incorporated by reference.

BACKGROUND

1. Field

Aspects of embodiments of the present disclosure relate to a display device.

2. Description of Related Art

Various display devices applied to a multimedia device, such as a television set, a mobile phone, a tablet computer, a navigation unit, a game unit, etc., have been developed.

Each display device includes a display panel to display an image. The display panel includes gate lines, data lines, and pixels connected to the gate lines and the data lines. In addition, the display device includes a display area through which the image is displayed and a non-display area disposed adjacent to the display area.

In recent years, various display devices are under development to reduce the non-display area and increase the display area. In this case, since the non-display area is reduced, driving parts arranged in the non-display area may partially overlap with the display area. As an example, a display device including a finger recognition sensor arranged overlapping the display area has been suggested.

Meanwhile, the driving parts may be attached to the display panel using a resin. When an ultraviolet ray is irradiated to the display panel from a lower side of the display panel to cure the resin, the irradiated ultraviolet ray may reach not only the resin but also an organic light emitting layer of a display module. As a result, the organic light emitting layer is deteriorated.

SUMMARY

According to an aspect of embodiments of the present disclosure, a display device may prevent an ultraviolet ray irradiated from a lower side of a display module from reaching a substrate after passing through a protective layer. According to an aspect of embodiments, a display device includes a fingerprint recognition sensor overlapping a display area.

According to one or more embodiments of the present disclosure, a display device includes: a display module comprising a display area and a non-display area; a protective layer on a lower surface of the display module and including an opening area overlapping with the display area; a sensor unit overlapping with the display area, covering the opening area, and arranged on the protective layer; and an adhesive member adhering the sensor unit and the protective layer.

In one or more embodiments, the sensor unit includes a sensor overlapping with the opening area, and a package attached to the protective layer by the adhesive member, and the sensor is mounted on the package.

In one or more embodiments, when viewed in a plan view of the display module, an area of the opening area is greater than an area of the sensor and smaller than an area of the package.

In one or more embodiments, the sensor includes a fingerprint recognition sensor.

In one or more embodiments, the display area includes a sensor area, and the sensor area overlaps with the sensor.

In one or more embodiments, the protective layer includes an ultraviolet ray absorbent to absorb an ultraviolet ray.

In one or more embodiments, the display device further includes a light blocking layer on the protective layer and including a first hole area defined therethrough overlapping with the sensor unit, and a cushion layer on the light blocking layer and including a second hole area defined therethrough overlapping with the first hole area, and each of an area of the first hole area and an area of the second hole area is greater than an area of the sensor unit when viewed in a plan view of the display module.

In one or more embodiments, the light blocking layer includes a double-sided tape to adhere the protective layer and the cushion layer.

In one or more embodiments, the area of the first hole area is equal to the area of the second hole area.

In one or more embodiments, the display device further includes a circuit board electrically connected to the display module and arranged under the protective layer, and a hole area is defined through the circuit board overlapping with the sensor unit.

In one or more embodiments, when viewed in a plan view of the display module, an area of the hole area is greater than an area of the sensor unit.

In one or more embodiments, the display device further includes a circuit board arranged under the protective layer and including a timing controller to apply a driving signal to the display module, and the sensor unit is electrically connected to the timing controller through a via defined through the circuit board and overlapping with the opening area.

In one or more embodiments, the display module includes a substrate on which the protective layer is arranged, a display element layer on the substrate overlapping with the display area, an encapsulation layer on the display element layer, and an input sensing unit on the encapsulation layer.

In one or more embodiments, the display element layer includes a plurality of organic light emitting diodes.

According to one or more embodiments of the present disclosure, a display device includes: a display module including a substrate in which a display area and a non-display area are defined; a protective layer on a lower surface of the substrate and including a first opening area overlapping with the display area; a light blocking layer on the protective layer and including a second opening area overlapping with the first opening area; a sensor unit overlapping with the display area, entirely covering the second opening area, and arranged on the light blocking layer; and an adhesive member adhering the sensor unit and the light blocking layer.

In one or more embodiments, the sensor unit includes a sensor overlapping with the second opening area, and a package attached to the light blocking layer by the adhesive member, and the sensor is mounted on the package.

In one or more embodiments, when viewed in a plan view, each of an area of the first opening area and an area of the second opening area is greater than an area of the sensor and smaller than an area of the package.

In one or more embodiments, the display device further includes a cushion layer on the light blocking layer and including a first hole area overlapping with the second opening area, and an area of the first hole area is greater than an area of the second opening area when viewed in a plan view.

In one or more embodiments, the display device further includes a circuit board electrically connected to the display module and arranged under the cushion layer, a second hole area is defined through the circuit board, and the second hole area has a same area as the first hole area and overlaps with the second opening area.

According to one or more embodiments of the present disclosure, a display device includes: a display module in which a display area and a non-display area are defined; a protective layer on a lower surface of the display module and including an opening area defined therethrough overlapping with each of the display area and the non-display area; a sensor unit overlapping with each of the display area and the non-display area, covering the opening area, and arranged on the protective layer; and an adhesive member adhering the sensor unit and the protective layer.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

Figure 1:
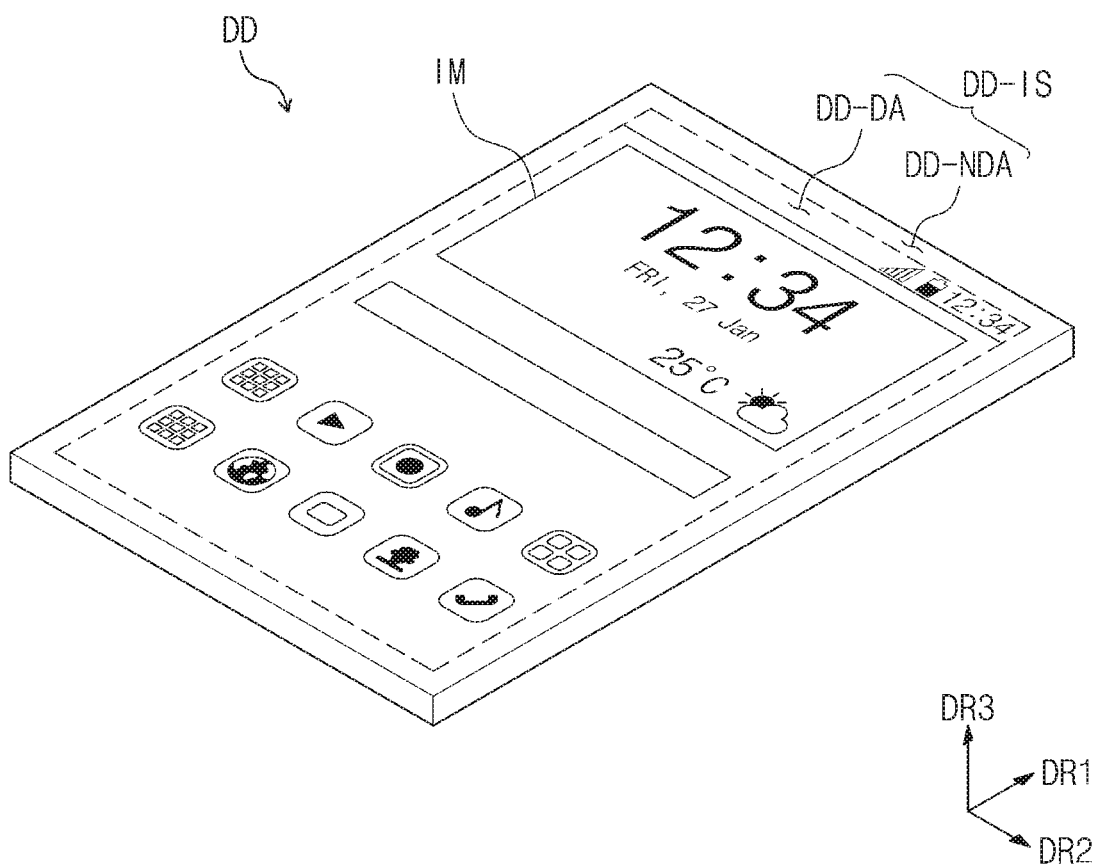
FIG. 1 is a perspective view showing a display device according to an exemplary embodiment of the present disclosure.

The present disclosure may be variously modified and realized in many different forms, and some example embodiments will be exemplified in the drawings and described in further detail herein. However, the present disclosure is not limited to the specific disclosed forms, and is to be construed to include all modifications, equivalents, or replacements included in the spirit and scope of the present invention.

Like numbers refer to like elements throughout. In the drawings, the thicknesses of layers, films, and regions may be exaggerated for clarity. As used herein, the term "and/or" includes any and all combinations of one or more of the associated listed items. The use of the terms "first," "second," etc. do not denote any order or importance, but rather the terms "first," "second," etc. are used to distinguish one element from another. Thus, a "first" element, component, region, layer, or section discussed below could be termed a "second" element, component, region, layer, or section without departing from the teachings of the present invention. It is to be understood that the singular forms "a," "an," and "the" include plural referents unless the context clearly dictates otherwise.

It is to be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Figure 2:
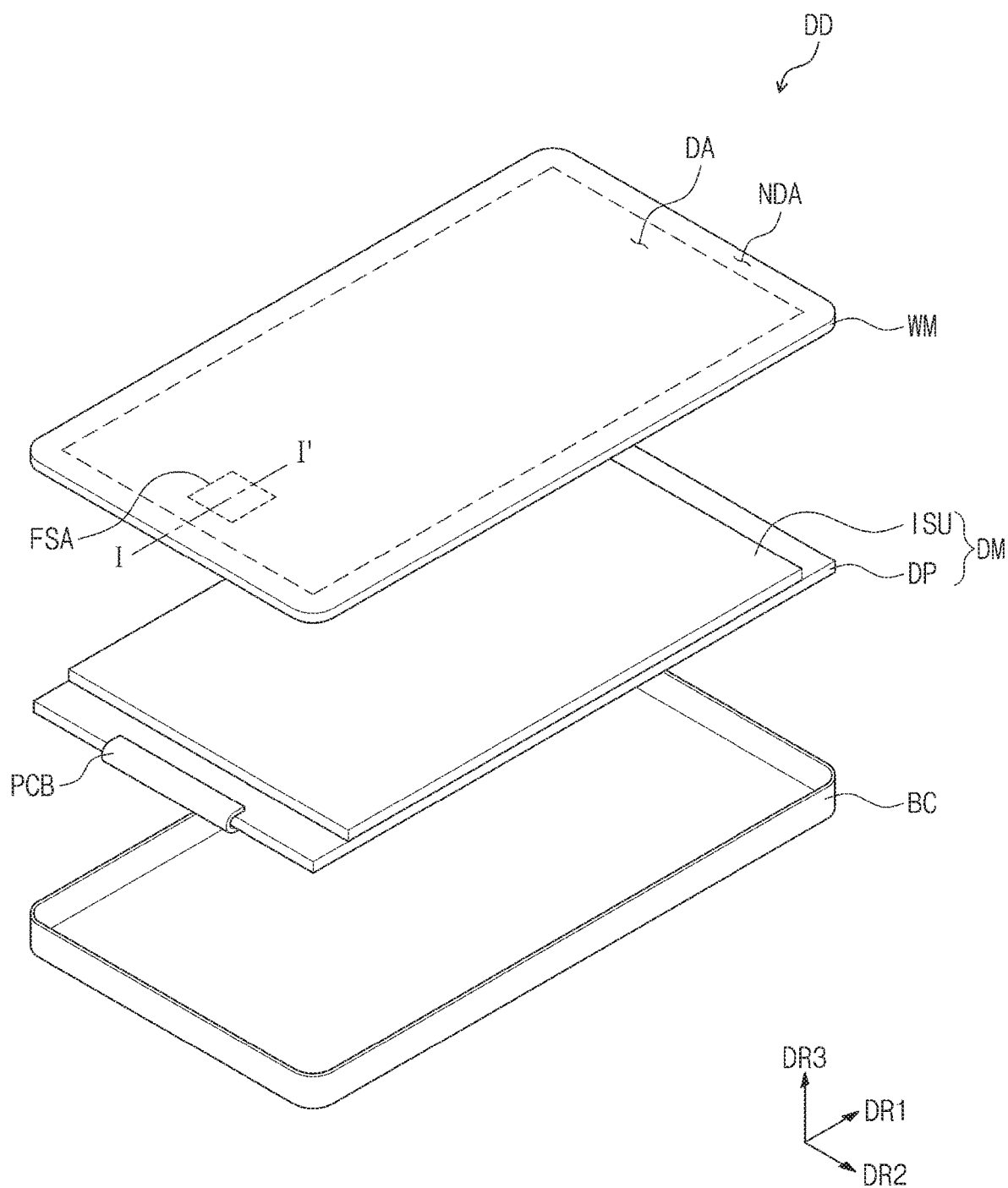
FIG. 2 is an exploded perspective view showing a display device according to an exemplary embodiment of the present disclosure.
Figure 3:
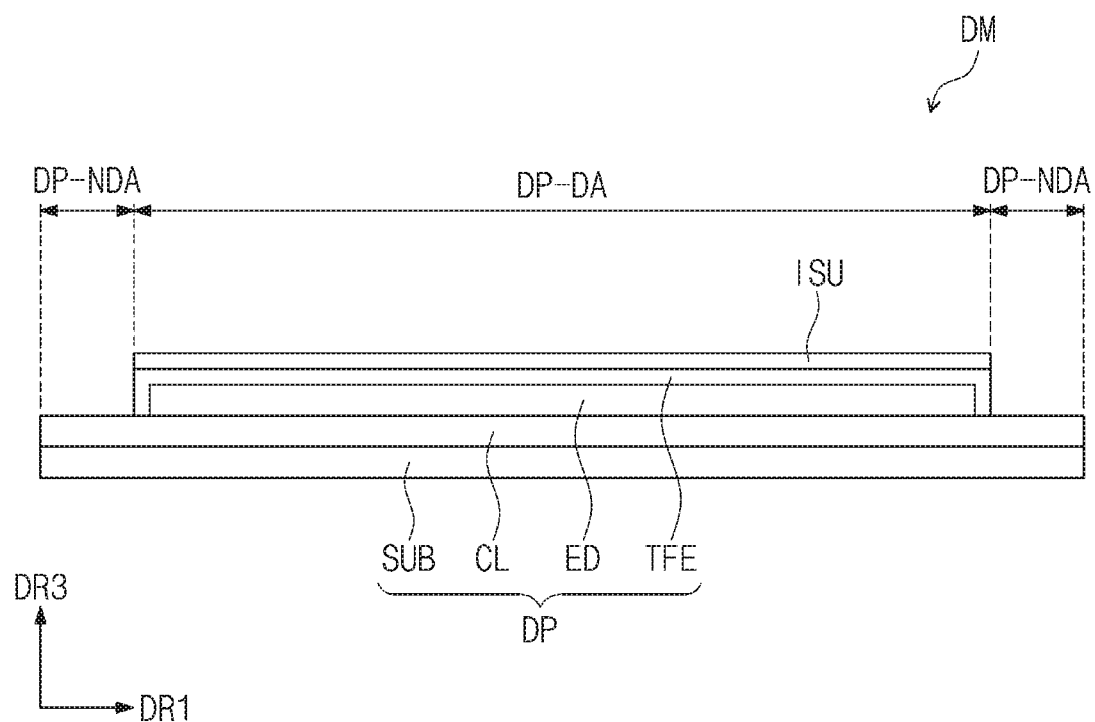
FIG. 3 is a cross-sectional view showing a display module according to an exemplary embodiment of the present disclosure.

FIG. 1 is a perspective view showing a display device DD according to an exemplary embodiment of the present disclosure; FIG. 2 is an exploded perspective view showing the display device DD according to an exemplary embodiment of the present disclosure; and FIG. 3 is a cross-sectional view showing a display module DM according to an exemplary embodiment of the present disclosure.

Referring to FIG. 1, the display device DD displays an image IM through a display surface DD-IS. In an embodiment, the display surface DD-IS is parallel (parallel or substantially parallel) to a surface defined by a first direction DR1 and a second direction DR2. A third direction DR3 indicates a normal line direction of the display surface DD-IS, i.e. a thickness direction of the display device DD.

Herein, front (or upper) and rear (or lower) surfaces of each member of the display device DD are distinguished from each other by the third direction DR3. However, directions indicated by the first, second, and third directions DR1, DR2, and DR3 are relative to each other, and, thus, the directions indicated by the first, second, and third directions DR1, DR2, and DR3 may be changed to other directions.

In the present exemplary embodiment of the present disclosure, the display device DD includes a flat type display surface, but it is not limited thereto or thereby. For example, the display device DD may include a curved type display surface or a three-dimensional type display surface. The three-dimensional type display surface may include a plurality of display areas indicating different directions from each other. As an example, the three-dimensional type display surface may include a polygonal-column type display surface.

The display device DD according to the present exemplary embodiment may be a rigid display device; however, the display device DD is not limited to the rigid display device. That is, the display device DD may be a flexible display device. In the present exemplary embodiment, the display device DD applicable to a mobile phone terminal will be described as a representative example. Although not shown in figures, electronic modules mounted on a main board, a camera module, and a power module may be placed in a bracket/case with the display device DD to form the mobile phone terminal. The display device DD according to the present disclosure may be applied to any of a large-sized electronic item, such as a television set, a monitor, etc., and a medium and small-sized electronic item, such as a tablet computer, a car navigation unit, a game unit, a smart watch, etc.

As shown in FIG. 1, the display surface DD-IS includes a display area DD-DA through which the image IM is displayed and a non-display area DD-NDA disposed adjacent to the display area DD-DA. The image IM is not displayed through the non-display area DD-NDA. FIG. 1 shows images of icons as a representative example of the image IM.

As shown in FIG. 1, in an embodiment, the display area DD-DA has a quadrangular shape, and the non-display area DD-NDA surrounds the display area DD-DA. However, the shape of the display area DD-DA and the shape of the non-display area DD-NDA may be designed variously. As an example, the non-display area DD-NDA may be disposed adjacent to only one side of the display area DD-DA or may be omitted.

Referring to FIG. 2, in an embodiment, the display device DD includes a window member WM, a display module DM, a circuit board PCB, and an accommodation member BC.

The window member WM is disposed above the display module DM and transmits an image provided from the display module DM through a display area DA. As an example, the window member WM may include any of glass, sapphire, plastic, or the like. The window member WM includes the display area DA and a non-display area NDA, and the display area DA and the non-display area NDA respectively overlap with the display area DD-DA and the non-display area DD-NDA defined in the display device DD.

In an embodiment, the window member WM has a single layer structure, as shown in FIG. 2; however, the window member WM may include a plurality of layers. As an example, the window member WM may include a base layer and at least one bezel layer disposed on a lower surface of the base layer to correspond to the non-display area DD-NDA.

According to the present exemplary embodiment, the display area DA may include a sensor area FSA. The sensor area FSA may overlap with the display area DA and, in an embodiment, may be an area used to recognize a fingerprint.

In a case in which the sensor area FSA overlaps with the non-display area NDA, the display area DA may be reduced by an area of the sensor area FSA. However, since the display device DD according to the present disclosure has a structure in which the sensor area FSA overlaps with the display area DA, the display area DA may be enlarged by the area of the sensor area as compared with the area of the display area DA when the sensor area is defined in the non-display area NDA.

According to an exemplary embodiment of the present disclosure, a sensor unit may be disposed on the display module DM to correspond to the sensor area FSA. This will be described in further detail later.

The display module DM is disposed between the window member WM and the accommodation member BC. In an embodiment, the display module DM includes a display panel DP and an input sensing unit ISU, and the input sensing unit ISU is disposed between the window member WM and the display panel DP.

According to an exemplary embodiment of the present disclosure, the display panel DP may be an organic light emitting diode display panel, a plasma display panel, an electrophoretic display panel, a microelectromechanical system display panel, an electrowetting display panel, etc.

Herein, the organic light emitting diode display panel will be described as the display panel DP. However, the inventive concept of the present disclosure is not limited thereto or thereby, and any of various display panels may be applied according to embodiments.

The display panel DP generates the image and transmits the image to the window member WM. The display panel DP overlaps with the display area DD-DA.

The input sensing unit ISU obtains coordinate information of an external input. In an embodiment, the input sensing unit ISU may be directly disposed on the display panel DP. In the present exemplary embodiment, the input sensing unit ISU may be manufactured by a continuous process with the display panel DP, but embodiments are not limited thereto or thereby. For example, the input sensing unit ISU may be provided as an individual panel and attached to the display panel DP by an adhesive member.

Although not shown in figures, the display module DM according to an exemplary embodiment of the present disclosure may further include a reflection prevention layer. The reflection prevention layer may include a color filter, a stack structure of a conductive layer/a dielectric layer/a conductive layer, or an optical member. The reflection prevention layer absorbs, destructively interferes, or polarizes a light incident thereto from an outside.

The accommodation member BC accommodates the display module DM and is coupled to the window member WM.

Referring to FIG. 3, the display module DM includes a display area DP-DA and a non-display area DP-NDA, and the display area DP-DA and the non-display area DP-NDA respectively overlap with the display area DA and the non-display area NDA defined in the window member WM.

In an embodiment, the display module DM includes a substrate SUB, a circuit layer CL disposed on the substrate SUB, a display element layer ED, and an encapsulation layer TFE. In an embodiment, the substrate SUB includes at least one plastic film. In an embodiment, the substrate SUB includes a plastic substrate that is flexible, a glass substrate, a metal substrate, or an organic/inorganic composite substrate.

The circuit layer CL includes a plurality of insulating layers, a plurality of conductive layers, and a semiconductor layer. The conductive layers of the circuit layer CL serve as signal lines or control circuits of the pixel.

In an embodiment, the display element layer ED includes organic light emitting diodes. The display element layer ED may include a plurality of organic light emitting diodes as a light emitting element. The display element layer ED may further include an organic layer, such as a pixel definition layer.

The encapsulation layer TFE encapsulates the display element layer ED. The encapsulation layer TFE includes at least one insulating layer. The encapsulation layer TFE according to an exemplary embodiment of the present disclosure may include at least one inorganic layer (herein, referred to as "encapsulation inorganic layer"). The encapsulation layer TFE according to an exemplary embodiment of the present disclosure may include at least one organic layer (herein, referred to as "encapsulation organic layer") and at least one encapsulation inorganic layer.

The encapsulation inorganic layer protects the display element layer ED from moisture and oxygen, and the encapsulation organic layer protects the display element layer ED from foreign matter, such as dust. In an embodiment, the encapsulation inorganic layer includes a silicon nitride layer, a silicon oxynitride layer, a silicon oxide layer, a titanium oxide layer, or an aluminum oxide layer; however, it is not limited thereto. In an embodiment, the encapsulation organic layer includes an acrylic-based organic layer, but it is not limited thereto.

In an embodiment, the display module DM may include an encapsulation substrate encapsulating the display element layer ED rather than the encapsulation layer TFE. The encapsulation substrate may include any of glass, sapphire, plastic, and the like.

According to an exemplary embodiment of the present disclosure, the input sensing unit ISU is directly disposed on the encapsulation layer TFE. The input sensing unit ISU includes input sensing electrodes and signal lines. The input sensing electrodes and the signal lines may have a single- or multi-layer structure. According to an embodiment, the input sensing unit ISU may be coupled to the encapsulation layer TFE by an adhesive member disposed on the encapsulation layer TFE.

In an embodiment, the input sensing electrodes and the signal lines may include indium tin oxide, indium zinc oxide, zinc oxide, indium tin zinc oxide, PEDOT, metal nanowire, or graphene. Touch sensors and touch signal lines may include a metal layer, e.g., molybdenum, silver, titanium, copper, aluminum, or an alloy thereof. The touch sensors and the touch signal lines may have the same layer structure or different layer structures.

Figure 4:
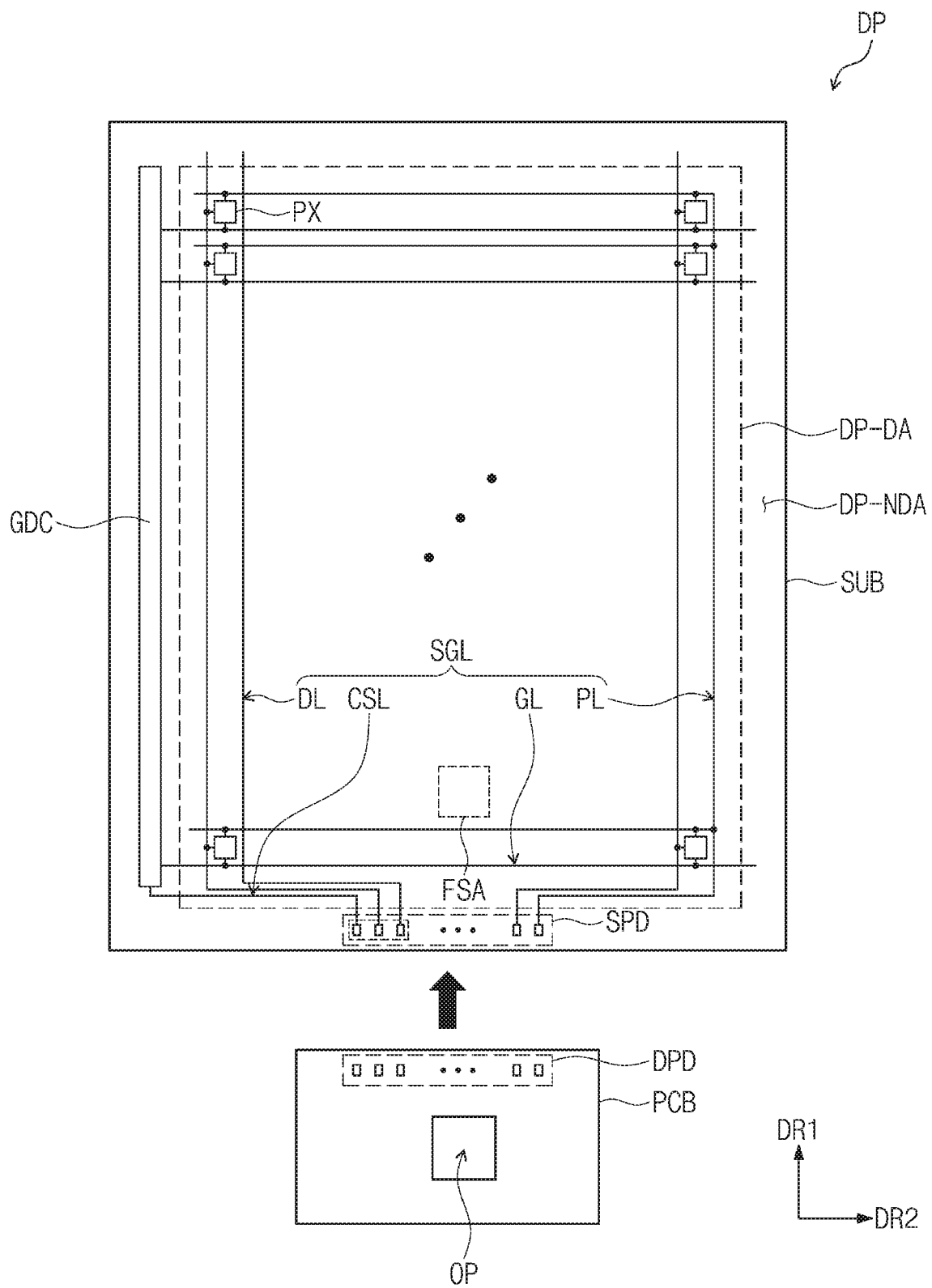
FIG. 4 is a plan view showing a display panel according to an exemplary embodiment of the present disclosure.
Figure 5:
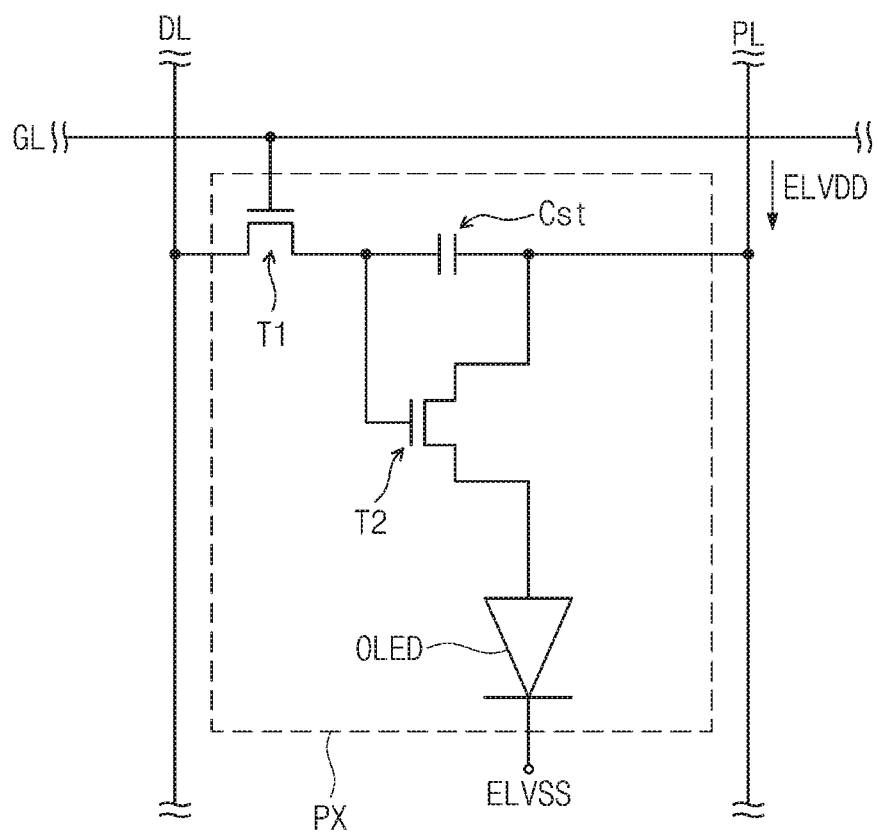
FIG. 5 is an equivalent circuit diagram showing a pixel shown in FIG. 4.

FIG. 4 is a plan view showing a display panel according to an exemplary embodiment of the present disclosure; and FIG. 5 is an equivalent circuit diagram showing a pixel shown in FIG. 4.

Referring to FIG. 4, the display panel DP includes a driving circuit GDC, a plurality of signal lines SGL, a plurality of signal pads arranged in a signal pad area SPD, and a plurality of pixels PX.

The pixels PX are arranged in the display area DP-DA. In an embodiment, each of the pixels PX includes an organic light emitting diode and a pixel driving circuit connected to the organic light emitting diode. The driving circuit GDC, the signal lines SGL, the signal pads, and the pixel driving circuit may be included in the circuit layer CL shown in FIG. 3.

The driving circuit GDC includes a scan driving circuit. The scan driving circuit generates a plurality of scan signals (herein, referred to as "scan signals") and sequentially outputs the scan signals to a plurality of scan lines GL (herein, referred to as "scan lines") described below. The scan driving circuit may further output another control signal to the driving circuit of the pixels PX.

The scan driving circuit may include a plurality of thin film transistors formed through a same process as the driving circuit of the pixels PX, e.g., a low temperature polycrystalline silicon (LTPS) process or a low temperature polycrystalline oxide (LTPO) process.

The signal lines SGL are disposed on the substrate SUB. The signal lines SGL includes the scan lines GL, data lines DL, a power line PL, and a control signal line CSL. Each of the scan lines GL is connected to a corresponding pixel PX of the pixels PX, and each of the data lines DL is connected to a corresponding pixel PX of the pixels PX. The power line PL is connected to the pixels PX. The control signal line CSL applies control signals to the scan driving circuit.

The signal lines SGL overlap with the display area DP-DA and the non-display area DP-NDA. Each of the signal lines SGL includes a pad part and a line part. The line part overlaps with the display area DP-DA and the non-display area DP-NDA. The pad part is connected to an end of the line part. The pad part is disposed in the non-display area DP-NDA and corresponds to the signal pad disposed in the signal pad area SPD described above.

The circuit board PCB is connected to the display panel DP and includes a plurality of connection pads disposed in a connection pad area DPD. The connection pads are connected to the signal pads disposed in the signal pad area SPD of the display panel DP to transmit a plurality of driving signals to the display panel DP. The circuit board PCB may be rigid or flexible. In an embodiment, the circuit board PCB is flexible, and a flexible printed circuit board may be provided as the circuit board PCB.

In FIG. 4, the circuit board PCB is illustrated as separated from the display panel DP, but the circuit board PCB may be disposed on a portion of the non-display area DP-NDA of the display panel DP and may overlap with the display area DP-DA and the non-display area DP-NDA. For example, the circuit board PCB may be bent along a side portion of the substrate SUB and disposed on a rear surface of the display panel DP.

According to an exemplary embodiment of the present disclosure, the circuit board PCB may include a hole area OP defined therethrough. In an embodiment, when the circuit board PCB is bent along a side portion of the substrate SUB, the hole area OP defined through the circuit board PCB overlaps with the sensor area FSA. This will be described in further detail with reference to FIG. 6.

In an embodiment, a timing control circuit may be disposed on the circuit board PCB to control an operation of the display panel DP. In an embodiment, the timing control circuit may be mounted on the circuit board PCB in the form of an integrated chip. In an embodiment, although not shown in figures, an input sensing circuit may be disposed on the circuit board PCB to control the input sensing unit ISU (refer to FIG. 3). The input sensing circuit may be mounted on the circuit board PCB in the form of an integrated chip.

In an embodiment, the timing control circuit and the input sensing circuit are mounted on the circuit board PCB; however, according to another embodiment, the timing control circuit and the input sensing circuit may be directly mounted on the non-display area DP-NDA of the display panel DP. In an embodiment, the timing control circuit and the input sensing circuit may be mounted on the circuit board PCB or the non-display area DP-NDA of the display panel DP in the form of a single integrated chip.

FIG. 5 shows one scan line GL, one data line DL, the power line PL, and the pixel PX connected to the one scan line GL, the one data line DL, and the power line PL. However, the configuration of the pixel PX is not limited to that shown in FIG. 5.

The organic light emitting diode OLED may be a front surface light-emitting type diode or a rear surface light-emitting type diode. The pixel PX includes a first transistor T1 (referred to as "switching transistor"), a second transistor T2 (referred to as "driving transistor"), and a capacitor Cst as the pixel driving circuit to drive the organic light emitting diode OLED. A first source voltage ELVDD is applied to the second transistor T2, and a second source voltage ELVSS is applied to the organic light emitting diode OLED. The second source voltage ELVSS may be lower than the first source voltage ELVDD.

The first transistor T1 outputs the data signal applied to the data line DL in response to the scan signal applied to the scan line GL. The capacitor Cst is charged with a voltage corresponding to the data signal provided from the first transistor T1.

The second transistor T2 is connected to the organic light emitting diode OLED. The second transistor T2 controls a driving current flowing through the organic light emitting diode OLED depending on an amount of electric charges charged in the capacitor Cst.

It is noted that the equivalent circuit shown in FIG. 5 is merely an embodiment of the present disclosure, and, thus, the configuration of the pixel PX is not limited to FIG. 5. The pixel PX may include a plurality of transistors and a large number of capacitors. The organic light emitting diode OLED may be connected between the power line PL and the second transistor T2.

Figure 6:
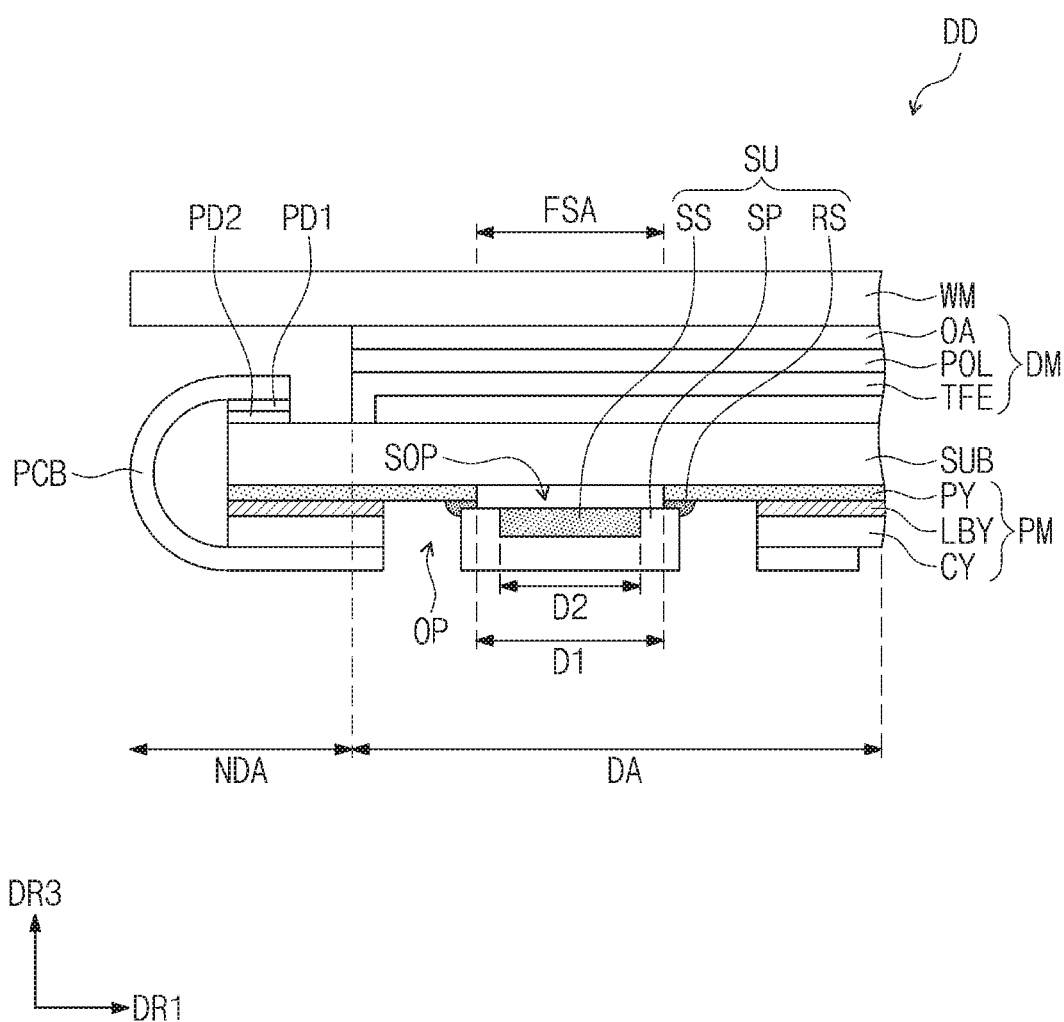
FIG. 6 is a cross-sectional view taken along the line I-I' of FIG. 2 according to an exemplary embodiment of the present disclosure.
Figure 7:
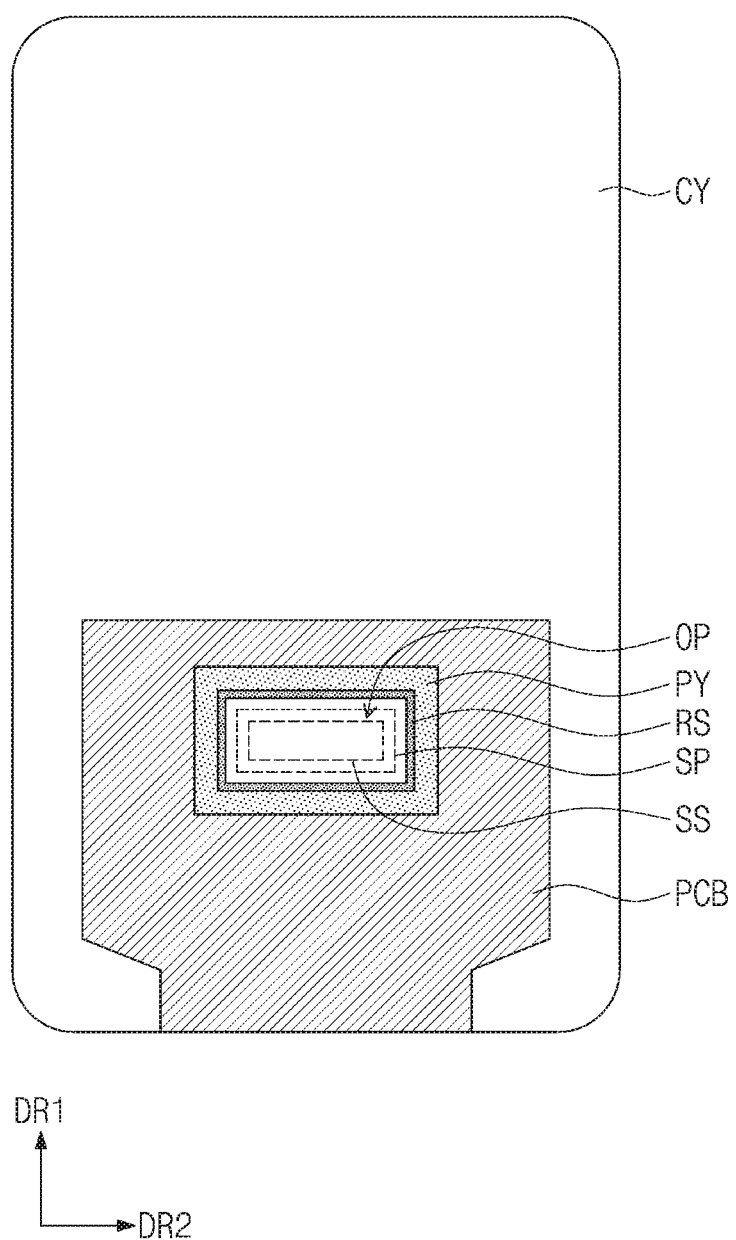
FIG. 7 is a plan view showing a rear surface of a display module according to an exemplary embodiment of the present disclosure.
Figure 8:
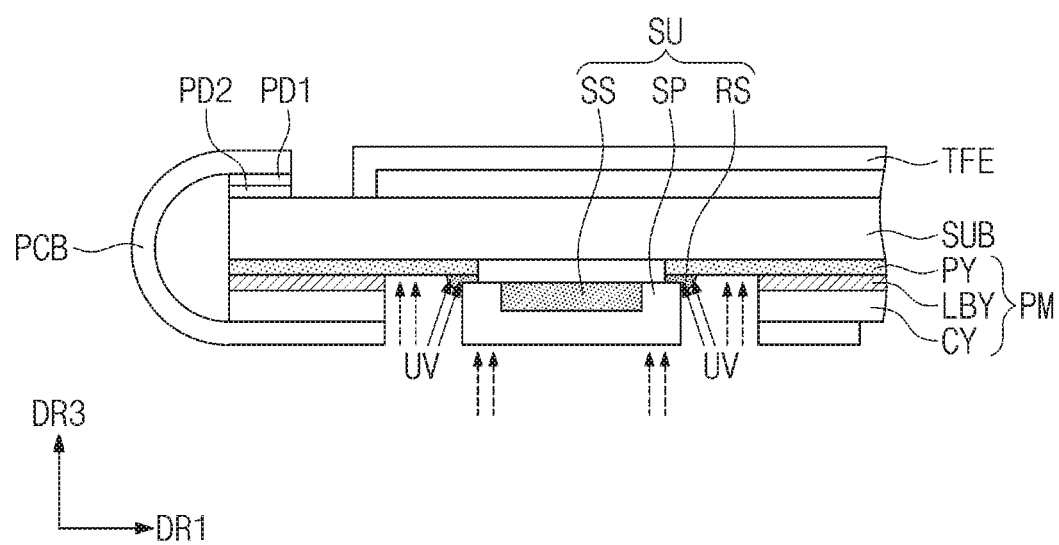
FIG. 8 is a cross-sectional view showing a portion of the display device shown in FIG. 6.

FIG. 6 is a cross-sectional view taken along the line I-I' of FIG. 2 according to an exemplary embodiment of the present disclosure; FIG. 7 is a plan view showing a rear surface of a display module according to an exemplary embodiment of the present disclosure; and FIG. 8 is a cross-sectional view showing a portion of the display device shown in FIG. 6.

Referring to FIGS. 6 and 7, the display device DD according to an embodiment further includes a sensor unit SU, a protective member PM, and an adhesive member RS in addition to the window member WM and the display module DM, which are described above. In an embodiment, the display module DM further includes a polarization layer POL and an adhesive layer OA, which are disposed between the window member WM and the encapsulation layer TFE, in addition to the substrate SUB and the encapsulation layer TFE described above.

In an embodiment, the input sensing unit ISU shown in FIG. 3 is described as being omitted, but the input sensing unit ISU may be disposed between the polarization layer POL and the encapsulation layer TFE. In an embodiment, although not shown in figures, the circuit layer CL and the display element layer ED, which are shown in FIG. 3, are disposed on the substrate SUB, and the display element layer ED is encapsulated by the encapsulation layer TFE.

The polarization layer POL may transmit a light substantially parallel to a polarization axis in one direction among lights emitted from the display element layer ED. In an embodiment, the polarization layer POL may be a coating type polarization layer or a polarization layer formed by a deposition process. The polarization layer POL may be formed by coating a material including a dichroic dye and a liquid crystal compound. The adhesive layer OA may adhere the window member WM and the display module DM.

In an embodiment, the protective member PM includes a protective layer PY, a light blocking layer LBY, and a cushion layer CY. The protective layer PY overlaps with the display area DA and the non-display area NDA. The protective layer PY is attached to the lower surface of the substrate SUB and protects the substrate SUB from the outside. As an example, the protective layer PY absorbs physical impacts from the outside or prevents or substantially prevents foreign matter or moisture from entering the display module DM. In an embodiment, the protective layer PY may be coated on the lower surface of the substrate SUB or attached to the lower surface of the substrate SUB in the form of film.

According to an exemplary embodiment of the present disclosure, the protective layer PY may include a material blocking ultraviolet rays. For example, the protective layer PY may include a base resin, an ultraviolet ray absorbent, and an inorganic particle. The ultraviolet ray absorbent and the inorganic particle may be distributed in the base resin. The base resin may be an acrylic-based resin, for example, a urethane acrylate resin, but is not limited thereto or thereby. That is, a base resin may be used in the protective layer PY without being limited to any particular base resin such that the base resin is optically transparent and capable of distributing the ultraviolet ray absorbent and the inorganic particle thereon.

As an example, the ultraviolet ray absorbent may include at least one of a benzotriazol-based compound, a benzophenone-based compound, a salicylic acid-based compound, a salicylate-based compound, a cyanoacrylate-based compound, a cinnamate-based compound, an oxanilide-based compound, a polystyrene-based compound, an azomethine-based compound, and a triazine-based compound.

In addition, according to an exemplary embodiment of the present disclosure, the protective layer PY may include an opening area SOP overlapping with the sensor area FSA when viewed in a plan view. The opening area SOP allows the light exiting from the sensor unit SU to be transmitted to the window member WM. Herein, the opening area SOP will be described as having a first area and a first length D1 in a cross-section, as shown in FIG. 6.

The light blocking layer LBY may be disposed on a lower surface of the protective layer PY, and the cushion layer CY may be disposed on a lower surface of the light blocking layer LBY. In an embodiment, the light blocking layer LBY may be a double-sided adhesive disposed between the protective layer PY and the cushion layer CY. In addition, the light blocking layer LBY may absorb an external light from the outside. As an example, the light blocking layer LBY may be a black layer to absorb the external light; however, it is not limited thereto or thereby. That is, the light blocking layer LBY may include any of a variety of materials that absorb the external light.

The cushion layer CY is disposed on the lower surface of the light blocking layer LBY and protects the display module DM from the outside. The cushion layer CY may include an elastic material, e.g., sponge or rubber.

The circuit board PCB is disposed on the substrate SUB overlapping with the non-display area NDA and bent to the lower surface of the substrate SUB along one side portion of the substrate SUB. As a result, a portion of the circuit board PCB overlaps with the non-display area NDA, and another portion of the circuit board PCB overlaps with the display area DA. A connection pad PD1 included in the circuit board PCB is connected to a signal pad PD2 disposed on the substrate SUB overlapping with the non-display area NDA.

The light blocking layer LBY includes a first hole area overlapping with the display area DA, and the cushion layer CY includes a second hole area overlapping with the first hole area. In an embodiment, the first hole area of the light blocking layer LBY and the second hole area of the cushion layer CY are defined to have the same area.

In an embodiment, as shown in FIG. 6, the first hole area of the light blocking layer LBY and the second hole area of the cushion layer CY may overlap with the hole area OP of the circuit board PCB. In addition, as an example, the first hole area of the light blocking layer LBY, the second hole area of the cushion layer CY, and the hole area OP of the circuit board PCB may be defined to have the same area (the same or substantially the same area) when viewed in a plan view.

The sensor unit SU may be disposed on the protective layer PY overlapping with the sensor area FSA included in the display area DA. Particularly, the sensor unit SU according to an exemplary embodiment of the present disclosure may be disposed on the protective layer PY to entirely cover the opening area SOP defined through the protective layer PY.

In further detail, the sensor unit SU may include a sensor SS and a package SP. According to an exemplary embodiment, the sensor SS may be implemented by a fingerprint recognition sensor and may be operated in an optical scheme, an ultraviolet ray scheme, or a capacitance scheme. However, the sensor SS is not limited to the fingerprint recognition sensor. That is, the sensor SS may be implemented by a camera, a pressure-sensitive sensor, a proximity sensor, an illuminance sensor, a temperature sensor, or the like, which is disposed under the display module DM.

The sensor SS overlaps with the opening area SOP overlapping with the sensor area FSA. When a user's finger touches the sensor area FSA, the sensor SS senses a fingerprint of the user and transmits the sensed signal to a control circuit included in the package SP.

The package SP includes the sensor SS mounted thereon to face the substrate SUB and transmits the sensed signal by the sensor SS to the circuit board PCB. The package SP includes a control circuit electrically connected to each of the circuit board PCB and the sensor SS. The control circuit applies the sensed signal to the circuit board PCB, and the circuit board PCB applies the sensed signal to the signal pad PD2 through the connection pad PD1.

The adhesive member RS fixes the package SP to the protective layer PY. According to an exemplary embodiment of the present disclosure, the adhesive member RS includes a resin. In an embodiment, the resin is placed to make contact with each of the package SP and the protective layer PY, and then a curing process is performed on the resin. In this case, the ultraviolet ray is irradiated from the lower side of the protective member PM toward the window member WM in order to cure the resin.

However, the ultraviolet ray may be entirely irradiated to between the package SP and the light blocking layer LBY without being concentrated to the adhesive member RS. In this case, if the protective layer PY does not block the ultraviolet ray, the ultraviolet ray may transmit through the substrate SUB, and the circuit layer CL (refer to FIG. 3) or the display element layer ED (refer to FIG. 3) disposed on the substrate SUB may be deteriorated.

According to an exemplary embodiment of the present disclosure, the package SP entirely covers the opening area SOP and is disposed on the protective layer PY. Accordingly, in the case that the ultraviolet ray is irradiated to between the package SP and the light blocking layer LBY, the ultraviolet ray may be transmitted to the adhesive member RS and the protective layer PY. Since the protective layer PY absorbs the ultraviolet ray, the ultraviolet ray may be prevented or substantially prevented from being transmitted to the substrate SUB.

As shown in FIG. 8, the protective layer PY may include the ultraviolet ray absorbent that absorbs the ultraviolet ray. As a result, when the ultraviolet ray irradiated to cure the adhesive member RS is transmitted to the protective layer PY, the protective layer PY may absorb the ultraviolet ray. In addition, since the package SP is disposed on the protective layer PY and covers the opening area SOP of the protective layer PY, the ultraviolet ray is not transmitted to the substrate SUB by the package SP. That is, the package SP may block the ultraviolet ray.

Referring to FIGS. 6 and 7 again, the sensor SS has a second area when viewed in a plan view and a second length D2 in a cross-section. In the plan view shown in FIG. 7, the second area of the sensor SS may be smaller than the first area of the opening area SOP. In the cross-sectional view shown in FIG. 6, the second length D2 of the sensor SS may be shorter than the first length D1 of the opening area SOP.

In an embodiment, the package SP may have an area wider than the first area of the opening area SOP when viewed in a plan view. In this case, the area of each of the first hole area of the light blocking layer LBY and the second hole area of the cushion layer CY may be greater than the area of the package SP. As a result, the package SP may be disposed in the first hole area of the light blocking layer LBY and the second hole area of the cushion layer CY when viewed in a plan view.

As described above, the sensor unit SU according to the present disclosure may be disposed on the protective layer PY to cover the opening area SOP. As a result, although the ultraviolet ray is irradiated from the lower side of the protective member PM toward the window member WM in order to cure the adhesive member RS, the ultraviolet ray does not pass through the substrate SUB. Accordingly, the circuit layer CL and the display element layer ED may be prevented from being deteriorated due to the ultraviolet ray.

Figure 9A:
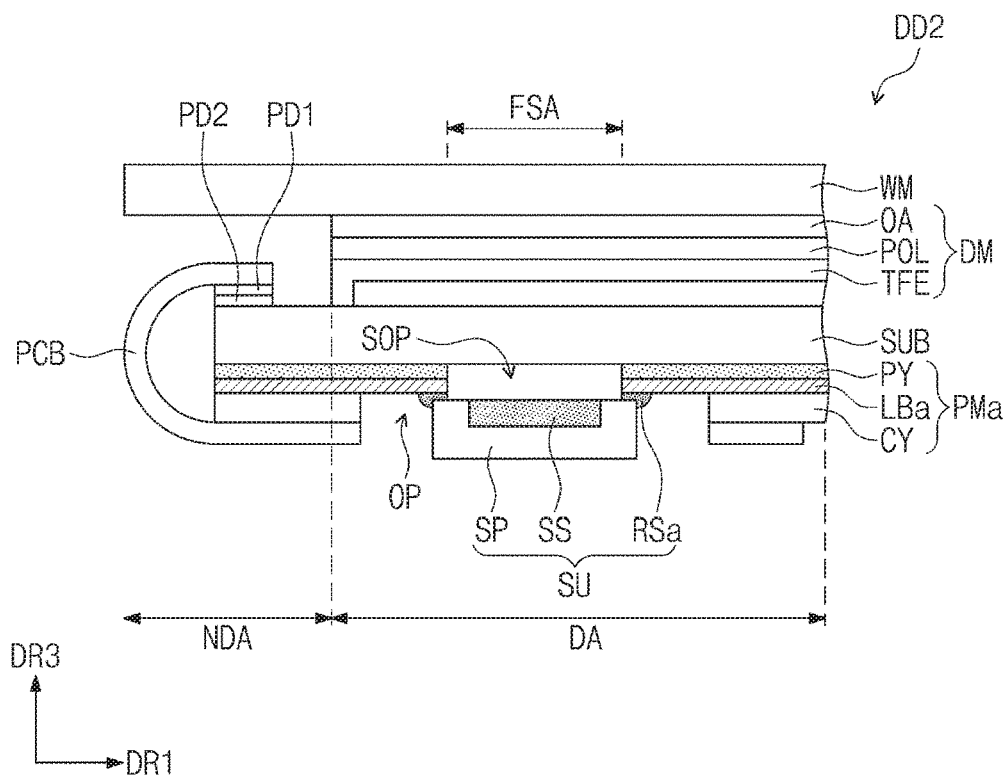
FIG. 9A is a cross-sectional view showing a portion of a display device according to another exemplary embodiment of the present disclosure, taken along a line corresponding to the line I-I' of FIG. 2.
Figure 9B:
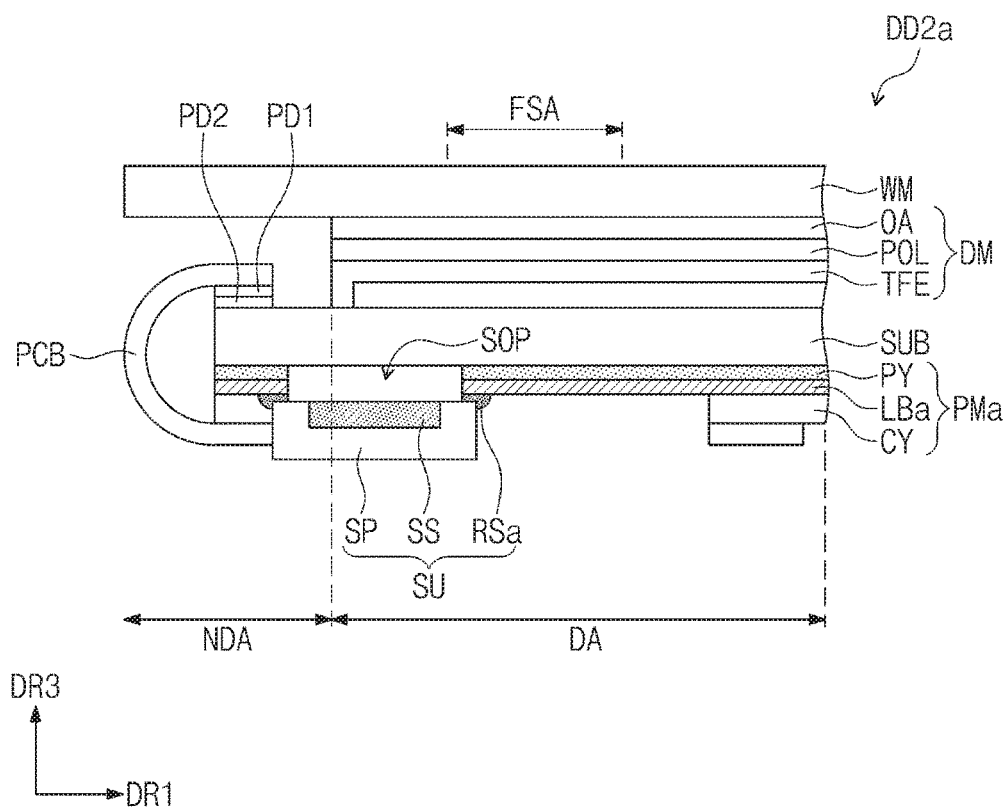
FIG. 9B is a cross-sectional view showing a portion of a display device according to another exemplary embodiment of the present disclosure, taken along a line corresponding to the line I-I' of FIG. 2.

FIG. 9A is a cross-sectional view showing a portion of a display device according to another exemplary embodiment of the present disclosure, taken along a line corresponding to the line I-I' of FIG. 2. FIG. 9B is a cross-sectional view showing a portion of a display device according to another exemplary embodiment of the present disclosure, taken along a line corresponding to the line I-I' of FIG. 2.

In an embodiment, a display device DD2 shown in FIG. 9A may have substantially the same structure and function except for a protective member PMa when compared with the display device DD shown in FIG. 6. Accordingly, the protective member PMa will be mainly described with reference to FIG. 9A, and further details of other components will be omitted.

Referring to FIG. 9A, a protective layer PY is attached to a lower surface of the substrate SUB, and a light blocking layer LBa is attached to a lower surface of the protective layer PY.

According to an exemplary embodiment of the present disclosure, the protective layer PY includes a first opening area overlapping with the display area DA. The light blocking layer LBa includes a second opening area overlapping with the first opening area. When viewed in a plan view, the first opening area and the second opening area may have the same (same or substantially the same) opening area SOP. That is, an area of the first opening area may be the same (same or substantially the same) as an area of the second opening area. Herein, according to the descriptions, the first opening area and the second opening area will be described as the opening area SOP shown in FIG. 9A.

According to an exemplary embodiment of the present disclosure, the area of the opening area SOP is greater than the area of the sensor SS and smaller than the area of the package SP. Accordingly, the package SP is disposed on the light blocking layer LBa to cover the opening area SOP.

A cushion layer CY is disposed on the light blocking layer LBa and includes a first hole area overlapping with the second opening area. When viewed in a plan view, an area of the first hole area may be greater than the area of the second opening area. The circuit board PCB is disposed under the cushion layer CY and includes a second hole area having the same area as that of the first hole area and overlapping with the second opening area.

When viewed in a plan view, the first hole area of the cushion layer CY and the second hole area of the circuit board PCB overlap with each other and have the same (same or substantially the same) area. Herein, according to the descriptions, the first hole area and the second hole area will be described as the hole area OP shown in FIG. 9A.

In an embodiment, an adhesive member RSa may be provided to each of the package SP and the light blocking layer LBa to fix the package SP of the sensor unit SU to the light blocking layer LBa. The adhesive member RSa may be a resin. Accordingly, in order to cure the resin, the ultraviolet ray may be irradiated from the lower side of the protective layer PY toward the window member WM.

According to an exemplary embodiment, the ultraviolet ray passing through between the package SP and the hole area OP of the circuit board PCB may be transmitted to each of the adhesive member RSa and the light blocking layer LBa. In this case, the ultraviolet ray transmitted to the light blocking layer LBa may be absorbed or reflected by the light blocking layer LBa. As a result, the ultraviolet ray may not be transmitted to the substrate SUB. In addition, the package SP may block the ultraviolet ray. In an embodiment, since the package SP entirely covers the second opening area and is disposed on the light blocking layer LBa, the ultraviolet ray may not be transmitted to the substrate SUB.

Referring to FIG. 9B, a display device DD2a according to an embodiment may have the same structure and function as those of the display device DD2 shown in FIG. 9A except for a position of a sensor unit SU.

According to an exemplary embodiment of the present disclosure, an opening area SOP shown in FIG. 9B may overlap with each of the display area DA and the non-display area NDA. Accordingly, the sensor unit SU shown in FIG. 9B may overlap with each of the display area DA and the non-display area NDA in order to cover the opening area SOP.

Figure 10:
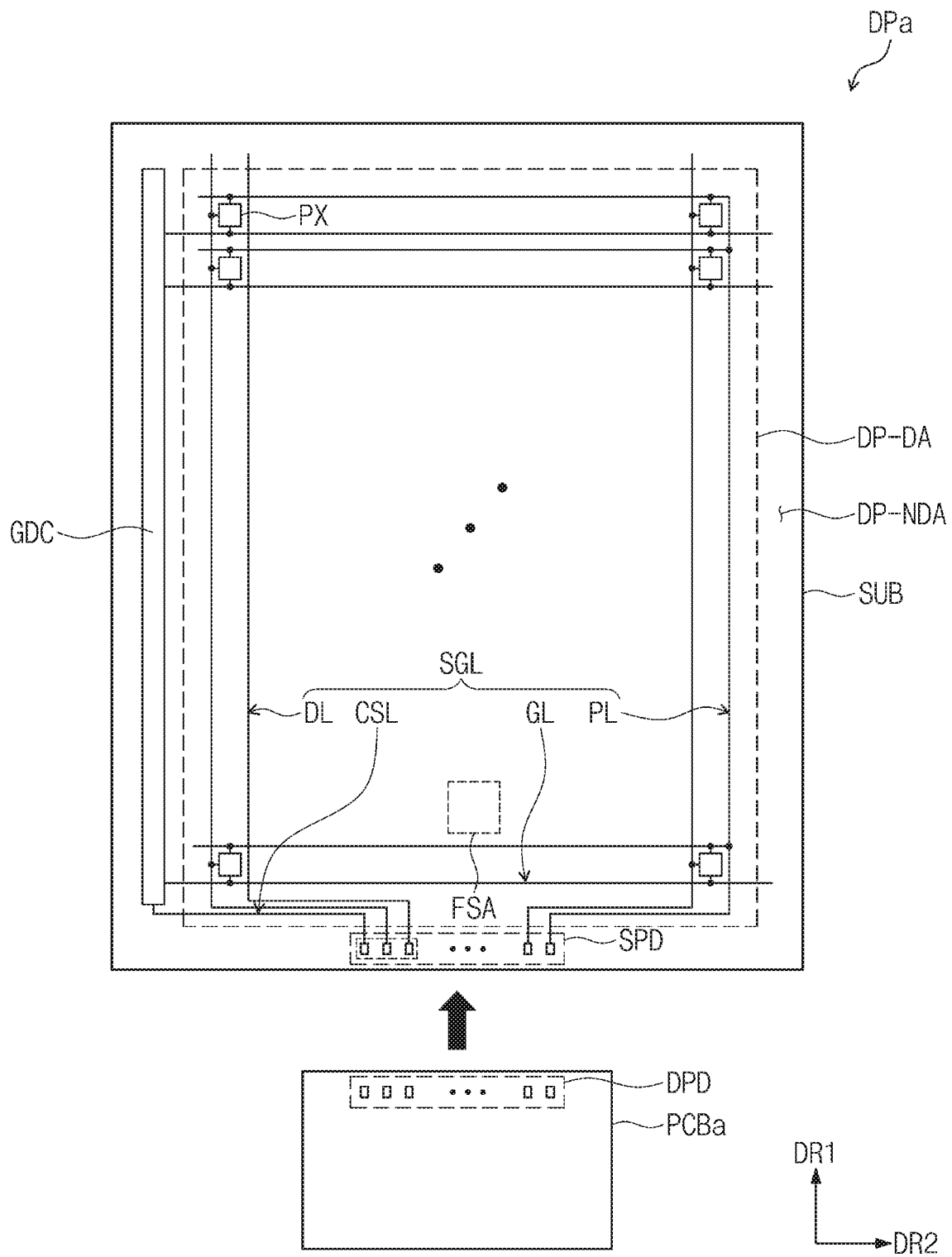
FIG. 10 is a plan view showing a display panel according to another exemplary embodiment of the present disclosure.
Figure 11:
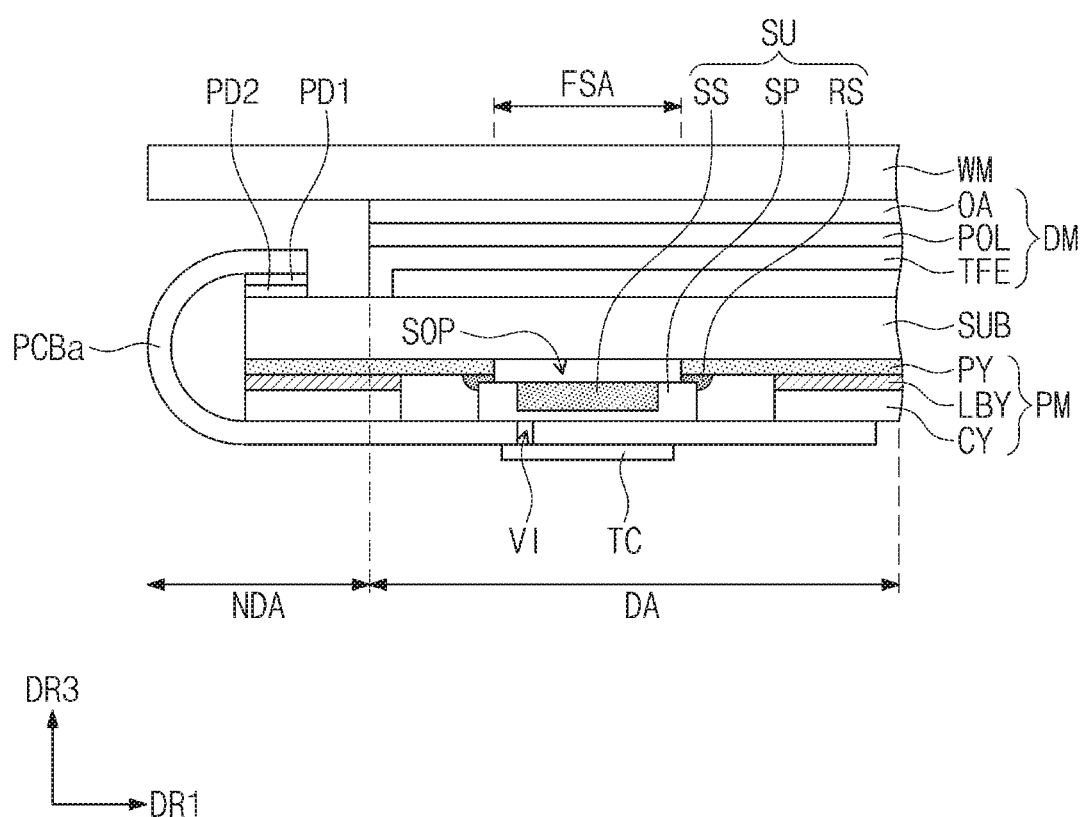
FIG. 11 is a cross-sectional view showing a portion of a display device according to another exemplary embodiment of the present disclosure, taken along a line corresponding to the line I-I' of FIG. 2.
Figure 12:
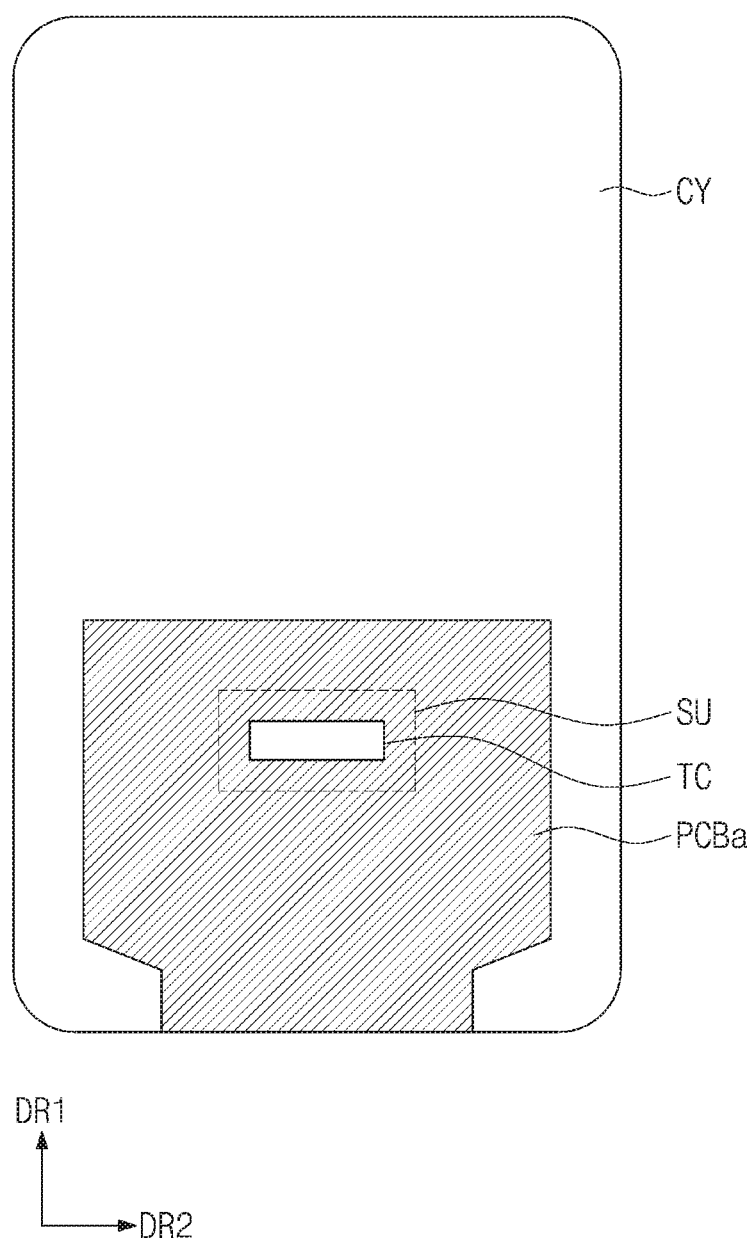
FIG. 12 is a plan view showing a rear surface of a display module according to another exemplary embodiment of the present disclosure.

FIG. 10 is a plan view showing a display panel DPa according to another exemplary embodiment of the present disclosure; FIG. 11 is a cross-sectional view showing a portion of a display device according to another exemplary embodiment of the present disclosure, taken along a line corresponding to the line I-I' of FIG. 2; and FIG. 12 is a plan view showing a rear surface of a display module according to another exemplary embodiment of the present disclosure.

The display panel DPa shown in FIG. 10 may have the same structure and function as those of the display panel DP shown in FIG. 4 except for a structure of a circuit board PCBa, and, thus, further details of other components except for the circuit board PCBa will be omitted.

Referring to FIG. 11, the circuit board PCBa may be disposed under the protective member PM. In an embodiment, the circuit board PCBa may not include the hole area when compared with the circuit board PCB shown in FIG. 4.

In an embodiment, a timing controller TC may be disposed on the circuit board PCBa. As an example, the timing controller TC may be disposed on an upper surface of the circuit board PCBa. A lower surface of the circuit board PCBa may face the package SP.

According to an exemplary embodiment of the present disclosure, the circuit board PCBa may include a via VI overlapping with the opening area SOP. The timing controller TC may be electrically connected to a control circuit included in the package SP through the via VI.

That is, the signal sensed by the sensor SS may be transmitted to the control circuit of the package SP. Here, the sensor SS may sense the fingerprint of the user through the sensor area FSA. The sensing signal transmitted to the control circuit from the sensor SS may be transmitted to the timing controller TC through the via VI. As a result, the timing controller TC may transmit the driving signal to the signal pad PD2 through the connection pad PD1 in response to the sensing signal.

In an embodiment, as shown in FIG. 12, since the circuit board PCBa does not include a separate hole area, the sensor unit SU may be entirely covered by the circuit board PCBa.

According to one or more embodiments, the package of the sensor unit entirely covers the opening area defined through the protective layer and is disposed on the protective layer.

According to one or more embodiments, the protective layer includes the ultraviolet ray absorbent to absorb the ultraviolet ray, and, thus, the ultraviolet ray which is irradiated from a lower side of the display module may be prevented from reaching the substrate after passing through the protective layer. As a result, a driving reliability of the display device may be improved.

As described above, some embodiments have been disclosed in the drawings and the specification. Although specific terms have been used herein, these are intended to describe the present embodiments and are not intended to limit the meanings of the terms or to restrict the scope of the accompanying claims. Accordingly, those skilled in the art will appreciate that various modifications and other equivalent embodiments are possible from the above embodiments. Therefore, the scope of the claims should be defined by the technical spirit of the specification.

What is claimed is:
1. A display device comprising:
a display module comprising a display area and a non-display area;
a protective layer on a lower surface of the display module and comprising an opening area overlapping with the display area;
a sensor unit overlapping with the display area, covering the opening area, and arranged on a lower surface of the protective layer;
a light blocking layer on the lower surface of the protective layer and comprising a first hole area overlapping with the sensor unit, an area of the first hole area being greater than each of an area of the opening area and an area of the sensor unit when viewed in a plan view of the display module;
an adhesive member arranged between a periphery of a top surface of the sensor unit and the lower surface of the protective layer, and adhering the sensor unit and the protective layer, the adhesive member in contact with each of the sensor unit and the protective layer, and wherein the opening area is defined between the lower surface of the display module and a portion of the top surface of the sensor unit that is inside the periphery on which the adhesive member is arranged; and
a cushion layer on the light blocking layer and comprising a second hole area overlapping with the first hole area, wherein an area of the second hole area is greater than the area of the sensor unit and equal to the area of the first hole area when viewed in the plan view of the display module.

2. The display device of claim 1, wherein the sensor unit comprises:
   a sensor overlapping with the opening area; and
   a package attached to the protective layer by the adhesive member, the sensor being mounted on the package.

3. The display device of claim 2, wherein the area of the opening area is greater than an area of the sensor and smaller than an area of the package when viewed in the plan view of the display module.

4. The display device of claim 2, wherein the sensor comprises a fingerprint recognition sensor.

5. The display device of claim 4, wherein the display area comprises a sensor area overlapping with the sensor.

6. The display device of claim 1, wherein the protective layer comprises an ultraviolet ray absorbent to absorb an ultraviolet ray.

7. The display device of claim 6, wherein the adhesive member comprises a resin curable by an ultraviolet ray.

8. The display device of claim 1, wherein the light blocking layer comprises a double-sided tape to adhere the protective layer and the cushion layer.

9. The display device of claim 1, further comprising a circuit board electrically connected to the display module and arranged under the protective layer, the circuit board comprising a hole area overlapping with the sensor unit.

10. The display device of claim 9, wherein an area of the hole area is greater than the area of the sensor unit when viewed in the plan view of the display module.

11. The display device of claim 1, further comprising a circuit board under the protective layer and comprising a timing controller to apply a driving signal to the display module, wherein the sensor unit is electrically connected to the timing controller through a via defined through the circuit board and overlapping with the opening area.

12. The display device of claim 1, wherein the display module comprises:
    a substrate on which the protective layer is arranged and in which the display area and the non-display area are defined;
    a display element layer on the substrate overlapping with the display area;
    an encapsulation layer on the display element layer; and
    an input sensing unit on the encapsulation layer.

13. The display device of claim 12, wherein the display element layer comprises a plurality of organic light emitting diodes.

14. A display device comprising:
    a display module comprising a substrate in which a display area and a non- display area are defined;
    a protective layer on a lower surface of the substrate and comprising a first opening area overlapping with the display area, the protective layer including an ultraviolet ray absorbent to absorb an ultraviolet ray;
    a light blocking layer on the protective layer and comprising a second opening area overlapping with the first opening area;
    a sensor unit overlapping with the display area, entirely covering the second opening area, and arranged on a lower surface of the light blocking layer;
    a cushion layer on the light blocking layer and comprising a first hole area overlapping with the second opening area, wherein an area of the first hole area is greater than an area of the second opening area when viewed in a plan view of the substrate; and
    an adhesive member arranged between a periphery of an upper surface of the sensor unit and the lower surface of the light blocking layer and adhering the sensor unit and the light blocking layer, wherein the first opening area and the second opening area are defined between the lower surface of the substrate and a portion of the upper surface of the sensor unit that is inside the periphery on which the adhesive member is arranged.

15. The display device of claim 14, wherein the sensor unit comprises:
    a sensor overlapping with the second opening area; and
    a package attached to the light blocking layer by the adhesive member, the sensor being mounted on the package.

16. The display device of claim 15, wherein each of an area of the first opening area and the area of the second opening area is greater than an area of the sensor and smaller than an area of the package when viewed in the plan view of the substrate.

17. The display device of claim 14, further comprising a circuit board electrically connected to the display module and arranged under the cushion layer, wherein a second hole area is defined through the circuit board, and the second hole area has a same area as the first hole area and overlaps with the second opening area.

18. The display device of claim 14, wherein the adhesive member comprises a resin curable by an ultraviolet ray.

19. A display device comprising:
    a display module comprising a display area and a non-display area;
    a protective layer on a lower surface of the display module and comprising an opening area overlapping with each of the display area and the non-display area;
    a light blocking layer on a lower surface of the protective layer and comprising a first hole area overlapping with the opening area;
    a sensor unit overlapping with each of the display area and the non-display area, covering the opening area, and arranged on the protective layer; and
    an adhesive member adhering the sensor unit and the protective layer, the adhesive member in contact with each of the sensor unit and the protective layer.

* * * * *